US008351204B2

(12) United States Patent
Yeo et al.

(10) Patent No.: US 8,351,204 B2
(45) Date of Patent: Jan. 8, 2013

(54) MODULAR DATA PROCESSING COMPONENTS AND SYSTEMS

(75) Inventors: Jong-Souk Yeo, Corvallis, OR (US); R. Stanley Williams, Portola Valley, CA (US); Chandrakant D. Patel, Fremont, CA (US); Duncan R. Stewart, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 225 days.

(21) Appl. No.: 12/864,230

(22) PCT Filed: Jan. 31, 2008

(86) PCT No.: PCT/US2008/052637
§ 371 (c)(1),
(2), (4) Date: Jul. 22, 2010

(87) PCT Pub. No.: WO2009/096974
PCT Pub. Date: Aug. 6, 2009

(65) Prior Publication Data
US 2010/0321880 A1 Dec. 23, 2010

(51) Int. Cl.
*H05K 7/20* (2006.01)
*H05K 5/00* (2006.01)
*G02B 6/00* (2006.01)
*H04B 10/00* (2006.01)

(52) U.S. Cl. ....... 361/695; 361/727; 454/184; 165/80.2; 174/547; 385/135; 398/122; 398/131

(58) Field of Classification Search ............ 361/679.46, 361/679.48, 695, 724–727; 454/184; 312/236; 165/80.2; 257/712, 721; 174/547, 16.1; 385/134, 135; 398/118–131
See application file for complete search history.

(56) References Cited

U.S. PATENT DOCUMENTS

| | | | |
|---|---|---|---|
| 3,833,836 A | 9/1974 | Moksu | |
| 4,612,670 A * | 9/1986 | Henderson | 398/22 |
| 4,850,044 A * | 7/1989 | Block et al. | 398/118 |
| 4,975,803 A | 12/1990 | Niggemann | |
| 5,204,866 A * | 4/1993 | Block et al. | 372/27 |
| 6,038,048 A * | 3/2000 | Harris et al. | 398/156 |
| 6,619,858 B1 | 9/2003 | Lytel | |
| 6,872,007 B2 * | 3/2005 | Botham | 385/53 |
| 6,958,908 B2 | 10/2005 | Lipski | |
| 7,035,549 B2 | 4/2006 | Davies | |
| 7,039,265 B2 * | 5/2006 | Levy et al. | 385/14 |
| 7,251,388 B2 | 7/2007 | Morris | |
| 7,312,987 B1 | 12/2007 | Konshak | |
| 7,448,810 B2 * | 11/2008 | Ko | 385/92 |
| 8,098,492 B2 * | 1/2012 | Rosenberg et al. | 361/736 |
| 2005/0259993 A1 * | 11/2005 | Davies et al. | 398/164 |
| 2006/0210229 A1 | 9/2006 | Scadden | |
| 2006/0221576 A1 * | 10/2006 | Takano et al. | 361/719 |
| 2006/0232930 A1 * | 10/2006 | Artman et al. | 361/695 |
| 2006/0274494 A1 * | 12/2006 | Thom | 361/685 |
| 2007/0253716 A1 * | 11/2007 | Nakaso et al. | 398/130 |
| 2011/0058817 A1 * | 3/2011 | Kuo et al. | 398/130 |

FOREIGN PATENT DOCUMENTS

| | | |
|---|---|---|
| JP | 06-216857 | 5/1994 |
| JP | 06-216857 | 8/1994 |

(Continued)

*Primary Examiner* — Zachary M Pape

(57) ABSTRACT

Data processing modules including a housing and optical interfaces associated with the exterior of the housing, and systems including the same.

11 Claims, 9 Drawing Sheets

FOREIGN PATENT DOCUMENTS

| JP | 07-221868 | 8/1995 |
| JP | 07-2211868 | 8/1995 |
| JP | 2003-121697 | 4/2003 |
| JP | 2003121697 | 4/2003 |

* cited by examiner

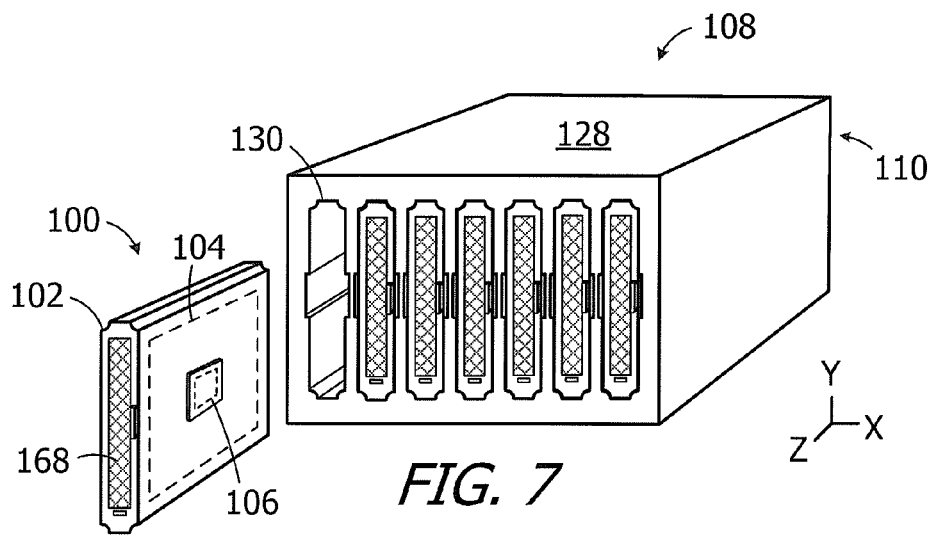
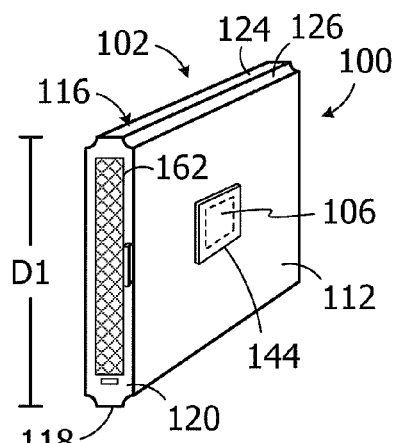 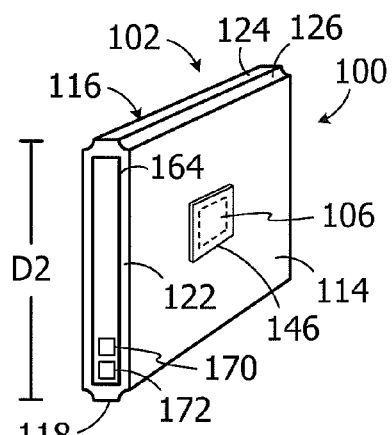
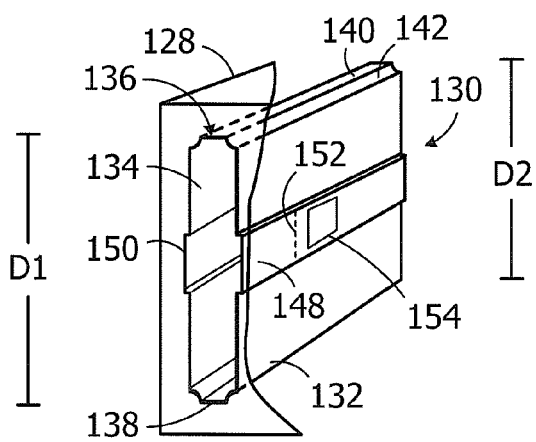 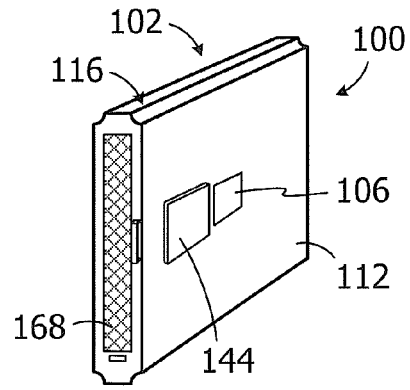

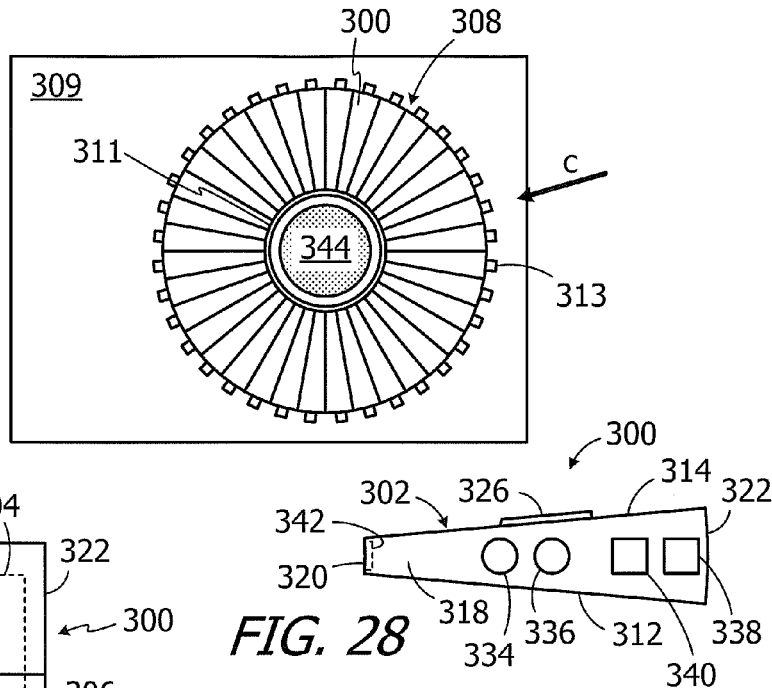
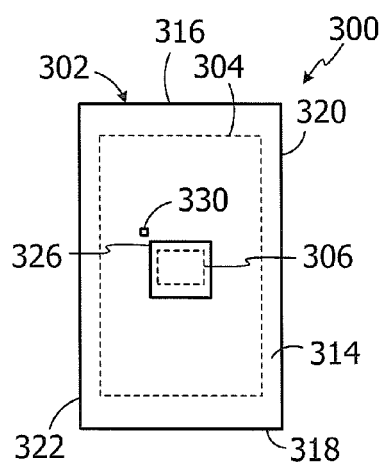
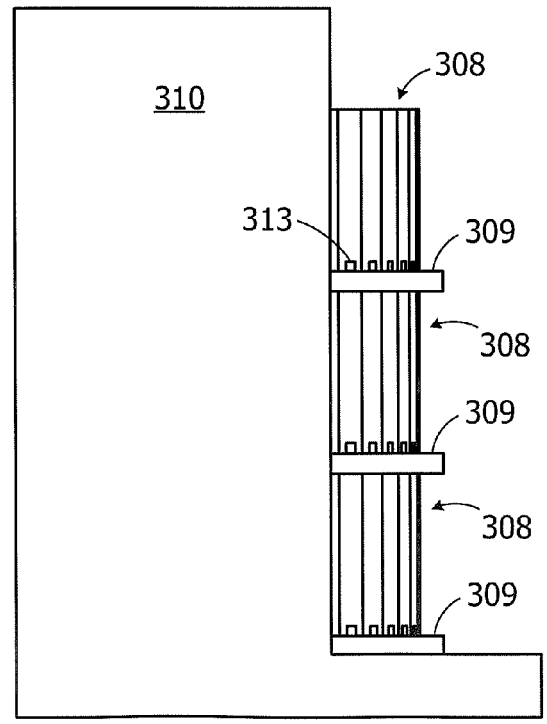

MODULAR DATA PROCESSING COMPONENTS AND SYSTEMS

BACKGROUND OF THE INVENTIONS

Although the present inventions are not limited thereto, a blade server is one example of data processing apparatus in which metal-based (e.g. copper-based) data transfer can be problematic. Blade servers are comprehensive computing systems that include processors and other application specific integrated circuits (ASICs), memory, storage, and associated electronics all on a circuit board. One or more server blades may be contained in an enclosure, along with server appliance blades, network-switch blades, storage blades, management blades, local-area-network (LAN) blades, and other blades. An ASIC may include one or more data processors which perform data processing operations in parallel with one or more ASICs on the same circuit board and which may communicate with the ASICs of other circuit boards in the system. The rearward end of the blades frequently includes connectors that mate with backplane connectors on the chassis within the enclosure when the blades are inserted into the enclosure. With respect to cooling, many blade server enclosures include fans or other blowers which create airflow. The air typically flows from the forward end of the blades to rearward end and over the electronic components.

The data communication between the blades is often through metal-based backplane data connections. One issue associated with metal-based backplane data connections stems from the fact that increases in data transfer may necessitate larger backplane data connectors, which can interfere with the air flow that is required for cooling. There are also issues associated with the use of metal-based data connections between components, e.g. between a central processing unit (CPU), memory and storage. Specifically, in order to form an efficiently functioning unit, the components must be located as close as possible to one another. This typically results in each blade including all of the components necessary for it to act as an efficiently functioning unit.

One proposed solution to some of the issues described above is to employ optical communication between circuit boards. For example, each board may include an array of light emitters and detectors that can communicate with one another. The present inventors have determined that such optical communication between boards may be challenging. For example, mechanical misalignment during installation, the operation of hard disk drive, and the air turbulence associated with cooling can result in circuit board vibrations that adversely effect free space optical links or require the use of costly mechanical coupling components. Also, free space optical communication can be adversely effected by the dust associated with air cooling and can require strenuous optics or dynamic steering of the beam to compensate for the board to board spacing and vibration. Optical backplane connections have also been proposed. However, in order to accommodate optical backplane connections, the associated enclosure must have an optical pathway routed through backplane, which can be expensive because it requires costly coupling components, and is inefficient in terms of the link budget and power consumption.

BRIEF DESCRIPTION OF THE DRAWINGS

Detailed description of embodiments will be made with reference to the accompanying drawings.

FIG. 7 is a perspective view of a data processing system in accordance with one embodiment of a present invention.

FIG. 8 is a front perspective view of a data processing module in accordance with one embodiment of a present invention.

FIG. 9 is a rear perspective view of the data processing module illustrated in FIG. 8.

FIG. 10 is a perspective view of a portion of an enclosure in accordance with one embodiment of a present invention.

FIG. 11 is a front perspective view of the data processing module illustrated in FIG. 8 with the optical interface cover in the open position.

FIG. 25 is a top view of a data processing system in accordance with one embodiment of a present invention.

FIG. 26 is a side view of one of the data processing modules illustrated in FIG. 25.

FIG. 27 is a side view of one of the data processing modules illustrated in FIG. 25.

FIG. 28 is a bottom view of one of the data processing modules illustrated in FIG. 25.

FIG. 29 is a side view of an enclosure that houses a plurality of the data processing systems illustrated in FIG. 25.

DETAILED DESCRIPTION OF THE EMBODIMENTS

The following is a detailed description of the best presently known modes of carrying out the inventions. This description is not to be taken in a limiting sense, but is made merely for the purpose of illustrating the general principles of the inventions. It is noted that detailed discussions of aspects of electronic components, systems and apparatus that are not required for the understanding of the present inventions have been omitted for the sake of simplicity. The present inventions are also applicable to a wide range of electronic components, systems and apparatus, including those presently being developed or yet to be developed.

Figure 1:
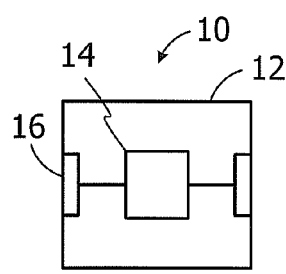
FIG. 1 is a diagrammatic view of a data processing module in accordance with one embodiment of a present invention.

As illustrated for example in FIG. 1, a data processing module 10 in accordance with one embodiment of a present invention includes a housing 12, one or more circuit boards 14, and at least two optical data interfaces 16 associated with the exterior of the housing. The optical data interfaces 16 may be used to transfer data from one module 10 to another. As is discussed in greater detail below with reference to FIGS. 7-36, the present data processing modules may be configured to be mounted in an enclosure that is configured to hold a plurality of modules, or may be configured to be secured to one or more other modules, to form data processing systems. In either case, the optical data interfaces 16 of adjacent data processing modules 10 will be aligned with one another when the housings 12 are mounted within the enclosure or are mechanically connected to one another. Other connections that may be associated with the data processing module 10, e.g. power and backplane data connections, are discussed below.

Figure 2:
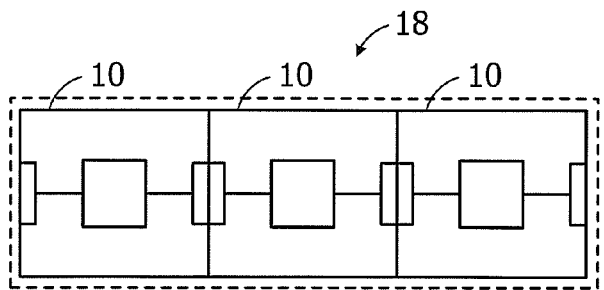
FIG. 2 is a diagrammatic view of a data processing system in accordance with one embodiment of a present invention.
Figure 3:
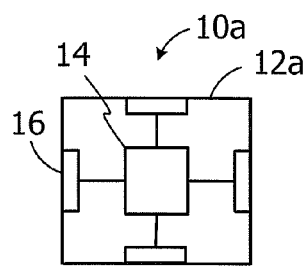
FIG. 3 is a diagrammatic view of a data processing module in accordance with one embodiment of a present invention.
Figure 4:
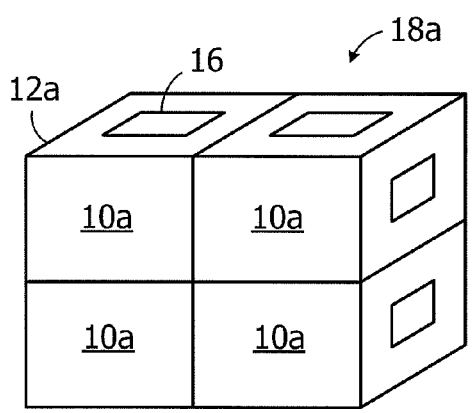
FIG. 4 is a perspective view of a data processing system in accordance with one embodiment of a present invention.
Figure 5:
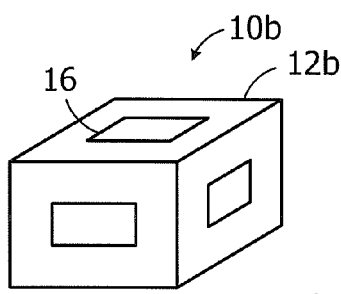
FIG. 5 is a perspective view of a data processing module in accordance with one embodiment of a present invention.
Figure 6:
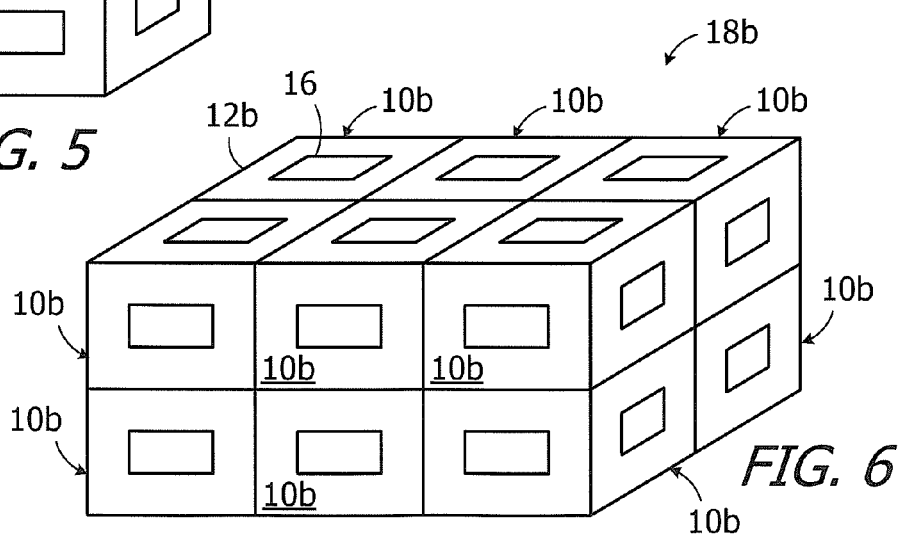
FIG. 6 is a perspective view of a data processing system in accordance with one embodiment of a present invention.

It should be noted that a plurality of modules 10 with two optical data interfaces 16 may be arranged in one-dimensional stacks, e.g. a horizontal stack (FIG. 2) or a vertical stack, to form a modular data processing system 18 with or without an enclosure 20. Turning to FIG. 3, an exemplary data processing module 10a has a housing 12a, one or more circuit boards 14, and four optical data interfaces 16. A plurality of data processing modules 10a may be arranged in a one dimensional stack or a two-dimensional stack, e.g. the horizontal and vertical stack illustrated in FIG. 4, with or without an enclosure, to form a modular data processing system 18a. The exemplary data processing module 10b illustrated in FIG. 5 includes a housing 12b, one or more circuit boards 14 (not shown), and six optical data interfaces 16 (three of the six are not shown). A plurality of data processing modules 10b may be arranged in one, two or three-dimensional stacks, e.g. the three-dimensional stack illustrated in FIG. 6, with or without an enclosure, to form a modular data processing system 18b. The present data processing modules may incorporate a wide variety of internal and external configurations, a wide variety of optical interfaces, more than one optical interface associated with the exterior of a side (or more than one side) of a housing, a wide variety of cooling configurations, and may be combined with a wide variety of enclosures in those instances where enclosures are employed.

There are a variety of advantages associated with modular data processing modules that facilitate optical data therebetween. By way of example, but not limitation, the present data processing module housings can be aligned with one another without the use of expensive coupling components because the optical interfaces can be placed in close proximity to one another, and in such a manner that the alignment will be maintained. Additionally, the benefits of board-to-board optical coupling can be obtained, i.e. the high bandwidth data transfer that cannot be achieved with reasonably sized metal-based connectors, without the expense associated with an enclosure-based optical pathway. The present optical data connections also facilitate the disaggregation of computing components, e.g. a CPU, memory and storage need not be carried or concentrated on the same circuit board. Such disaggregation provides more flexibility when designing systems and modifying existing systems.

As illustrated for example in FIGS. 7-14, an exemplary data processing module 100 includes a housing 102, one or more circuit boards 104, and a pair of optical interfaces 106 that are associated with the exterior of the housing. A plurality of the data processing modules 100 may be combined to form a data processing system 108 in, for example, an enclosure 110. In other words, the exemplary data processing modules 100 are configured for enclosure-based (or "rack-based") scaling. The capacity of the scalable data processing system 108 may be increased by simply positioning additional data processing modules 100 in the enclosure 110. Various options for the internal configuration of the present data processing modules, including the data processing modules 100 illustrated in FIGS. 7-14, as well as the specifics of the optical data connections that directly connect the modules to one another and the cooling of the modules, are described below with reference to FIGS. 30-35.

The exemplary data processing module housing 102 and enclosure 110 are configured to be self-aligning, thereby ensuring that, when the modules 100 are inserted into the enclosure, there will be proper alignment of the modules (including the optical interfaces 106) relative to the enclosure and relative to one another. To that end, the exemplary housing 102 includes walls 112 and 114, walls 116 and 118 that extend from one of the walls 112 and 114 to the other, a front wall 120 and a rear wall 122. In the exemplary embodiment, the walls 112 and 114 are planar and the walls 116 and 118 are, in whole or in part, either non-planar or not perpendicular to the walls 112 and 114. The exemplary walls 116 and 118 include planar portions 124 and curved portions 126. The enclosure 110 includes an external housing 128 and a plurality of internal receptacles 130 that have shapes corresponding to that of the module housing 102. Accordingly, and referring to FIG. 10, the internal receptacles 130 in the illustrated embodiment include walls 132 and 134 that are planar but for the slots 148 and 150 (discussed below) and walls 136 and 138 that include planar portions 140 and curved portions 142. It should also be noted that, in addition to corresponding shapes, the external dimensions of the module housings 102 are essentially the same as the internal dimensions of the enclosure receptacles 130 in order to insure a tight fit. Such an arrangement insures proper alignment in the X and Y-directions (FIG. 7). The exemplary module housings 102 and enclosure receptacles 130 are also dimensioned to facilitate self-alignment of the modules 100 (including the optical interfaces 106) relative to the enclosure 110 in the Z-direction. More specifically, the housings 102 and enclosure receptacles 130 each have a front dimension D1 that is greater than a rear dimension D2 such that the housings and the receptacles slope front to back. As a result, the module housing walls 116 and 118 will engage the enclosure receptacle walls 136 and 138 when the modules 100 have been inserted to such an extent that the modules (and optical interfaces 106) are aligned. The exemplary enclosure 110 also includes a releasable mechanical latch (not shown) which prevents movement of the modules 100 from moving out of the enclosure receptacles 130 after they have been completely inserted into the enclosure.

In other words, the module housings 102 and enclosure receptacles 130, by virtue of their shapes and sizes, together perform the function of aligning the optical interfaces 106 with one another.

The exemplary data processing module 100 may also include optical interface covers 144 and 146. Such covers may be removable or, as they are in the embodiment illustrated in FIGS. 7-14, the covers 144 and 146 may be integral parts of the housing 102 through the use of, for example, slots in the housing wall and mating rails on the cover (not shown) or other suitable instrumentalities. The enclosure receptacles 130 include slots 148 and 150 which accommodate the covers. The covers 144 and 146 are slidable relative to the housing 102 between a first position (FIGS. 8 and 9) where they cover and protect the optical interfaces 106 and a second position (FIG. 11) where the optical interfaces are uncovered. The enclosure 110 may be configured to move the covers 144 and 146 to the second position and, in the exemplary implementation, the receptacle slots 148 and 150 include respective inwardly extending protrusions 152 that engage the covers as the module is inserted into the enclosure.

Figure 12:
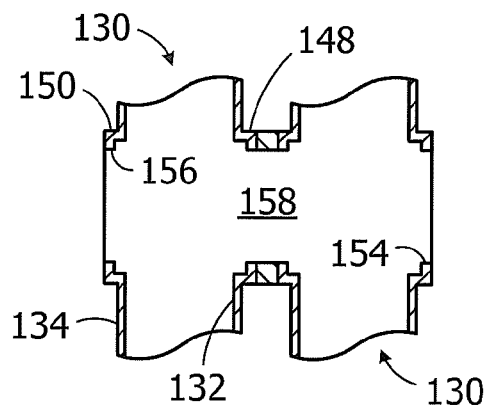
FIG. 12 is a section view of a portion of an enclosure in accordance with one embodiment of a present invention.
Figure 13:
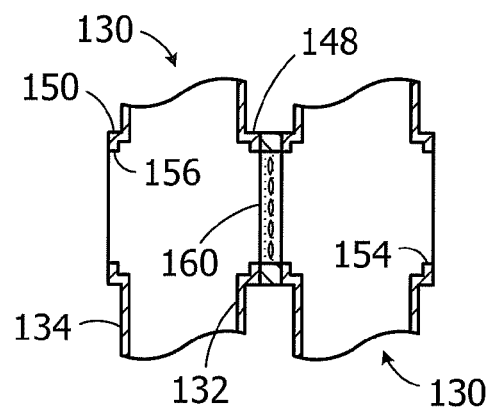
FIG. 13 is a section view of a portion of an enclosure in accordance with one embodiment of a present invention.
Figure 14:
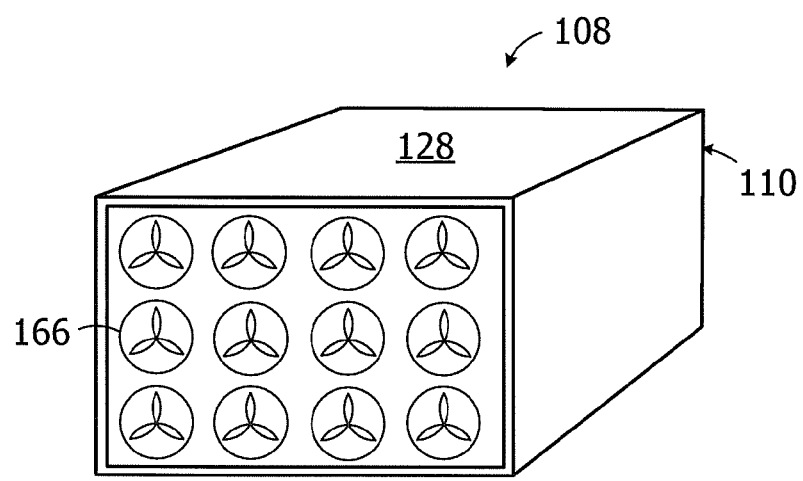
FIG. 14 is a rear perspective view of an enclosure in accordance with one embodiment of a present invention.
Figure 15:
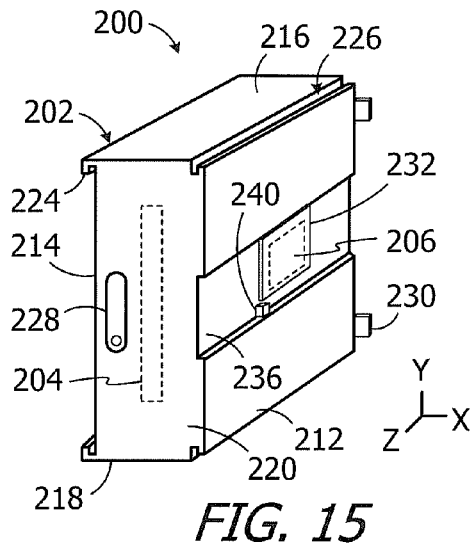
FIG. 15 is a front perspective view of a data processing module in accordance with one embodiment of a present invention.
Figure 16:
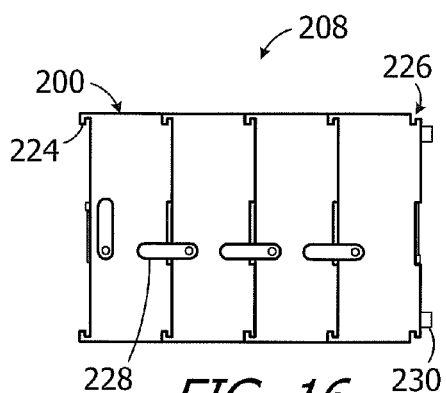
FIG. 16 is a front view of a data processing system including a plurality of the data processing modules illustrated in FIG. 15.
Figure 17:
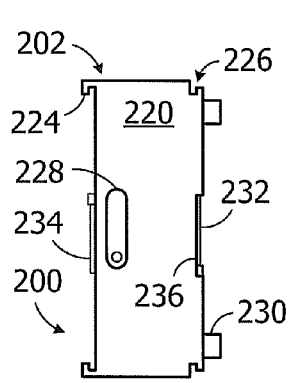
FIG. 17 is a front view of the data processing module illustrated in FIG. 15.
Figure 18:
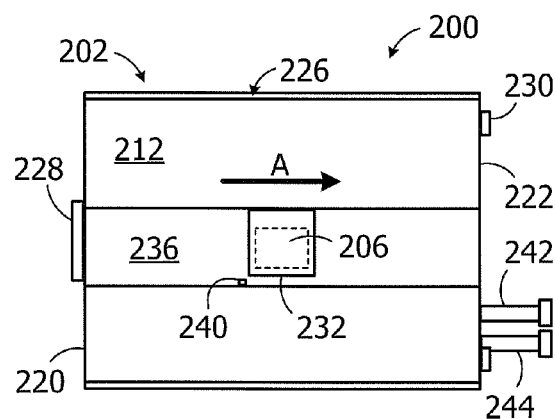
FIG. 18 is a side view of the data processing module illustrated in FIG. 15.

Turning to FIG. 12, the receptacles 130 also include openings 154 and 156 that are positioned such that they will be aligned with the optical interfaces 106 when the associated module 100 has been completely inserted into the enclosure 110. The coupling of optical interfaces from adjacent modules 100 can be accomplished though the use of an optical coupling apparatus such as one or more lenses, one or more microlens arrays, butt-coupling through a free space region or a glass window, hollow air core light guides, and/or other conventional coupling techniques. Thus, there may simply be free space region 158 or a glass window between the openings 154 and 156 of adjacent receptacles 130. Alternatively, as illustrated in FIG. 13, a lens array 160 may be positioned between the openings 154 and 156 of adjacent receptacles 130.

With respect to cooling, the exemplary modules 100 are cooled by air that flows through the housings 102. To that end, and referring to FIGS. 8, 9 and 14, the front and rear walls 120 and 122 include openings 162 and 164, and the rear of the enclosure 110 includes a plurality of fans 166. The fans 166 draw air into the module housings 102 by way of the front wall openings 162. The air travels through the interior of the module housings 102, over the circuit boards located therein, and then exits the module housings by way of the rear wall openings 164. A screen 168 covers the front wall opening 162 of each module 100 in the illustrated embodiment. Other devices that may be used to force air though the data processing modules 100 include, but are not limited to, a central high pressure, high flow rate pump such as a kinetic or positive displacement device (e.g. a centrifugal fan or piston-type device) with ducts that direct the air to the front wall openings 162 of the individual modules 100.

The exemplary modules also include data and power connectors 170 and 172 (FIG. 9). The data and power connectors 170 and 172 mate with corresponding backplane connectors (not shown) on the chassis within the enclosure when the modules 100 are inserted into the enclosure 110.

Turning to FIGS. 15-20, an exemplary data processing module 200 includes a housing 202, one or more circuit boards 204, and a pair of optical interfaces 206 that are associated with the exterior of the housing. A plurality of the data processing modules 200 may be combined without the use of an enclosure to form a data processing system 208. In other words, the exemplary data processing modules 100 are configured for module-based scaling. Such module-based scaling is particularly advantageous because it eliminates the up font expenses associated with an enclosure, especially an enclosure that it larger than current requirements. With module-based scaling, the capacity can simply be increased as desired through the use of additional data processing modules 200. Various options for the internal configuration of the present data processing modules, including the data processing modules 200 illustrated in FIGS. 15-20, as well as the specifics of the optical data connections that directly connect the modules to one another and the cooling of the modules, are described below with reference to FIGS. 30-35. It should also be noted that the exemplary housings 202 are closed and sealed, which eliminates dust related issues.

The exemplary data processing module housing 202 includes walls 212 and 214, walls 216 and 218 that extend from one of the walls 212 and 214 to the other, a front wall 220 and a rear wall 222. The module housing 202 may also be configured to be self-aligning, thereby ensuring that when modules 200 are connected to one another there will be proper alignment of the modules (including the optical interfaces 206) relative to one another in the X, Y and Z-directions. To that end, the housing 202 includes structures which perform the functions of securing adjacent modules 200 to one another, aligning the modules with one another, and positioning the optical interfaces 206 in close proximity to one another. In the illustrated embodiment, the housing 202 includes rails 224 and complementary slots 226 that vertically (in the illustrated orientation) align the modules 200 and keep the modules in close proximity to one another. The rails 224 and slots 226 allow the modules 200 to be coupled to one another by inserting the rear ends of the rails of one module into forward ends of the slots of another module and then sliding at least one of the modules relative to the other until the rear ends of the rails and slots are aligned with one another. With respect to the alignment of adjacent modules 200 (and optical interfaces 206) in the sliding direction (or z-direction), any suitable apparatus that is capable of locking the modules relative to one another in the aligned orientation may be employed. For example, in the illustrated embodiment, the front wall 220 of the housing 202 is provided with a pivotable latch 228 (or another suitable latching mechanism) and the rear wall 222 is provided with stops 230 in order to establish and maintain alignment in the sliding direction. In other exemplary implementations, similar stops may be positioned at the rear end of the slot 226 and/or the front end of the rail 224.

The exemplary data processing module 200 also includes optical interface covers 232 and 234. Such covers may be removable or, as they are in the embodiment illustrated in FIGS. 15-20, the covers 232 and 234 may be integral parts of the housing 202. The housing wall 212 includes a slot 236 that is configured to accommodate the cover 232, as well as the cover 234 of an adjacent module 200. The covers 232 and 234 are slidable in opposite directions relative to the housing 202 between a first position (FIGS. 18 and 20) where they cover and protect the optical interfaces 206 and a second position where the optical interfaces are uncovered. More specifically, the cover 232 is configured to slide in the direction of arrow A, i.e. toward the rear wall 222, and the cover 234 configured to slide in the direction of arrow B, i.e. toward the front wall 220. The covers 232 and 234 are biased to the closed position and are moved to the open positions by tabs 238 and 240 which extend outwardly from the housing walls 212 and 214. The tabs 238 and 240 engage the covers as the modules 200 are slidably connected in the manner described above and push the covers to their open positions.

Figure 19:
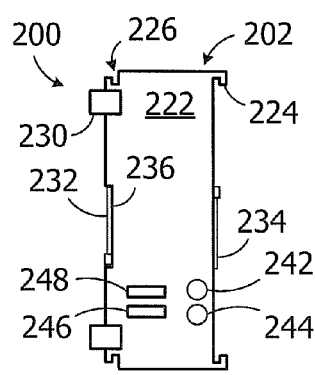
FIG. 19 is a rear view of the data processing module illustrated in FIG. 15.

With respect to cooling, the exemplary module 200 is fluid cooled by a cooling jacket that is located within housing 202. To that end, the exemplary module 200 includes fluid inlet and outlet connectors 242 and 244. Cooling jackets are described in greater detail below in the context of FIGS. 30-35. The exemplary module 200 also includes data and power connectors 246 and 248 (FIG. 19). The data and power connectors 246 and 248 mate with corresponding flexible data and power connectors (not shown).

Figure 24:
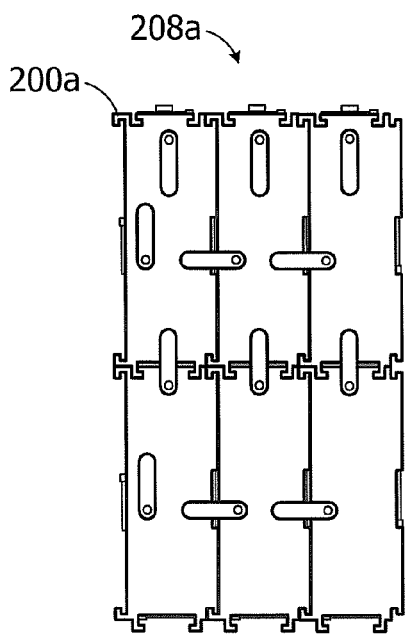
FIG. 24 is a front view of a data processing system including a plurality of the data processing modules illustrated in FIG. 21.

Another exemplary data processing module is generally represented by reference numeral 200a in FIGS. 21-24. The data processing module 200a is substantially similar to the data processing module 200 and similar elements are represented by similar reference numerals. Here, however, the data processing module 200a includes four optical interfaces 206. The optical interfaces are associated with the exterior of a respective one of the four walls 212-218 of the housing 202a. As such, a plurality of the modules 200a may be combined to form a two-dimensional data processing system 208a (FIG. 24).

In order to insure that the modules 200a (and the additional two optical interfaces 206) are properly aligned, the housing 202a is provided with a second set of rails 224a and complementary slots 226a that horizontally (in the illustrated orientation) align the modules 200a that are stacked in the y-direction and keep the modules in close proximity to one another. Here too, the rails 224a and slots 226a allow the modules 200a to be coupled to one another by inserting the rear ends of the rails of one module into forward ends of the slots of another module and then sliding at least one of the modules relative to the other until the rear ends of the rails and slots are aligned with one another. The front wall 220 of the housing 202 may be provided with a second pivotable latch 228a (or another suitable latching mechanism) and the rear wall 222 may be provided with a stop 230a in order to establish and maintain alignment in the sliding direction.

The exemplary data processing module 200a also includes optical interface covers 232a and 234a for the optical interfaces associated with the exterior of the housing walls 216 and 218. Such covers may be removable or, as they are in the embodiment illustrated in FIGS. 21-24, the covers 232a and 234a may be integral parts of the housing 202a. The wall 218 includes a slot 236a that is configured to accommodate the cover 234a, as well as the cover 232a of an adjacent module 200a. The covers 232a and 234a are slidable in opposite directions relative to the housing 202 between a first position where they cover and protect the optical interfaces 206 and a second position where the optical interfaces are uncovered. More specifically, the cover 232a is configured to slide toward the rear wall 222, and the cover 234 configured to slide toward the front wall 220. The covers 232a and 234a are biased to the closed position and are moved to the open positions by tabs 238a and 240a. The tabs 238a and 240a engage the covers 232a and 234a as the modules 200a are slidably connected in the manner described above.

It should also be noted that module housings associated with the present inventions are not limited to generally rectangular shapes and, instead, may be any shape that is suitable. By way of example, but not limitation, the exemplary data processing modules 300 illustrated in FIGS. 25-29 each include a housing 302, one or more circuit boards 304, and a pair of optical interfaces 306 that are associated with the exterior of the housing. The housings 302 are shaped such that a plurality of the modules 300 may be combined to form an annular data processing system 308. The annular data processing system 308 may be carried on a support 309 that is removably mounted within an enclosure 310 (as shown). Alternatively, the modules may be configured to be mechanically interconnected in, for example, the manner described above with reference to FIGS. 15-20. Various options for the internal configuration of the present data processing modules, including the data processing modules 300 illustrated in FIGS. 25-29, as well as the specifics of the optical data connections that directly connect the modules to one another and the cooling of the modules, are described below with reference to FIGS. 30-35.

The exemplary data processing module housing 302 includes side walls 312 and 314, top and bottom walls 316 and 318 that extend from one of the walls 312 and 314 to the other, a curved front wall 320 and a curved rear wall 322. With respect to alignment, the removable support 309 includes a relatively short internal wall 311 that abuts the housing front walls 320 and depressible latches 313 that abut the housing rear walls 322.

The exemplary data processing module 300 also includes optical interface covers 324 and 326. Such covers may be removable or, as they are in the embodiment illustrated in FIGS. 25-29, the covers 324 and 326 may be integral parts of the housing 302. The housing wall 312 includes a slot 328 that is configured to accommodate the cover 324, as well as the cover 326 of an adjacent module 300. The covers 324 and 326 are slidable in opposite directions relative to the housing 302 between a first position (FIGS. 26 and 27) where they cover and protect the optical interfaces 306 and a second position where the optical interfaces are uncovered. More specifically, the cover 324 is configured to slide toward the rear wall 322, and the cover 326 configured to slide toward the front wall 320 when one module 300 positioned next to another by moving the module in the direction of arrow C (FIG. 25). The covers 324 and 326 are biased to the closed position and are moved to the open positions by tabs 330 and 332 which extend outwardly from the housing walls 312 and 314. The tabs 330 and 332 engage the covers 324 and 326 as the modules 300 are slidably positioned relative to one another and push the covers to their open positions.

With respect to cooling, the exemplary module 300 is fluid cooled by a cooling jacket that is located within housing 302. To that end, the module 300 includes fluid inlet and outlet connectors 334 and 336. Cooling jackets are described in greater detail below in the context of FIGS. 30-35. The exemplary module 300 also includes data and power connectors 338 and 340 (FIG. 28). The module connectors 334-340 mate with corresponding connectors (not shown) on enclosure support 309 when the modules are slid into place.

The exemplary enclosure 310 accommodates three data processing systems 308 and data may be transferred from a module 300 in one system to a module in another. To that end, and referring to FIGS. 25 and 28, the front wall 320 of each module 300 includes an optical interface 342 and the enclosure 310 includes an optical core 344 that consists of a plurality of separable sections that can be pulled out of the enclosure along with the supports 309. The ends of each section of the optical core 344 include a free space connection which facilitates the optical coupling of the optical core sections to one another.

It should also be noted that, in those instances where fewer than all of the data processing modules 300 illustrated in FIG. 25 are required to satisfy the data processing requirements of the system 308, placeholder modules (not shown) may be substituted for one or more of the data processing modules. Such placeholder modules, include a housing 302 and with a pair of optical interfaces 306 (and covers 324 and 326), are configured to fit into the annular system in the same manner as the data processing modules. The optical interfaces 306 of each placeholder modules are connected to one another such that optical signals simply pass through the placeholder modules.

As alluded to above, the present data processing modules may have a wide variety of internal configurations and optical interfaces. The following exemplary configurations and optical interfaces are described in the context of data processing modules 200 and 200a. Nevertheless, with minor variations (e.g. the use of four optical interfaces instead of two), the configurations and optical interfaces described in the context of data processing module 200 are applicable to the data processing module 200a, the configurations and optical interfaces described in the context of data processing module 200a are applicable to the data processing module 200, and the configurations and optical interfaces described in the context of data processing modules 200 and 200a are applicable to data processing modules 100 and 300 described above as well as the data processing modules 200b and 400 described below.

Figure 30:
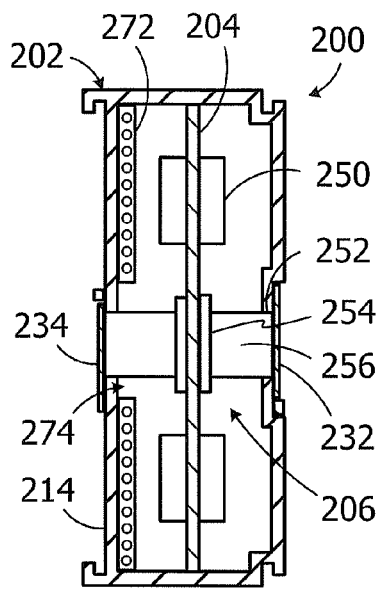
FIG. 30 is a partial section view of a data processing module in accordance with one embodiment of a present invention.
Figure 31:
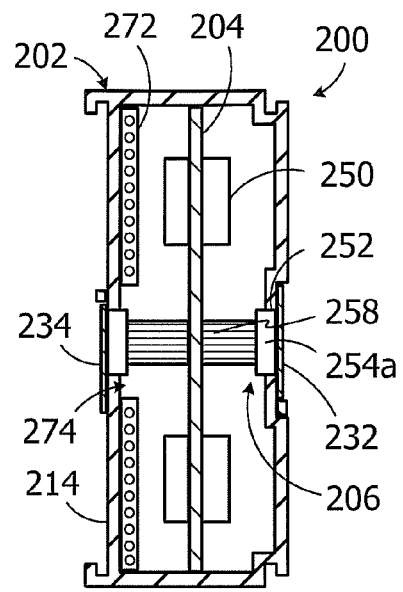
FIG. 31 is a partial section view of a data processing module in accordance with one embodiment of a present invention.

As illustrated for example in FIG. 30, the exemplary data processing module 200 includes a housing 202, a circuit board 204 with various ASICs and/or other components generally represented by reference numeral 250, and a pair of optical interfaces 206 that are associated with the exterior of the module. The optical interfaces 206 each include optoelectronic components 254 (e.g. emitters, detectors, lenses, and associated circuitry) and a light pipe 256 that extends from the optoelectronic components to the surface of the housing 202 by way of the housing apertures 252. Suitable emitters include, but are not limited to LEDs and VCSELs. Suitable light pipes include large core hollow light guides, optical fiber bundles and ribbons, a large lens, and microlens arrays. Alternatively, as is illustrated for example in FIG. 31, the optical interfaces 206 include optoelectronic components 254a (e.g. emitters, detectors, lenses, and associated circuitry) that are mounted within the housing aperture 252 and are connected to the circuit board 204 by a ribbon cable 258 or other suitable electrical connector.

Figure 32:
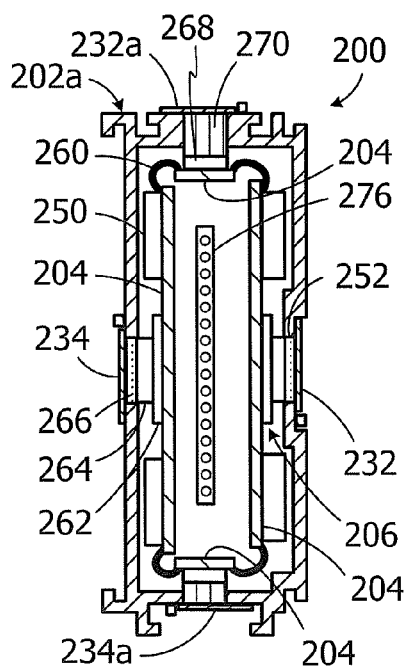
FIG. 32 is a partial section view of a data processing module in accordance with one embodiment of a present invention.
Figure 33:
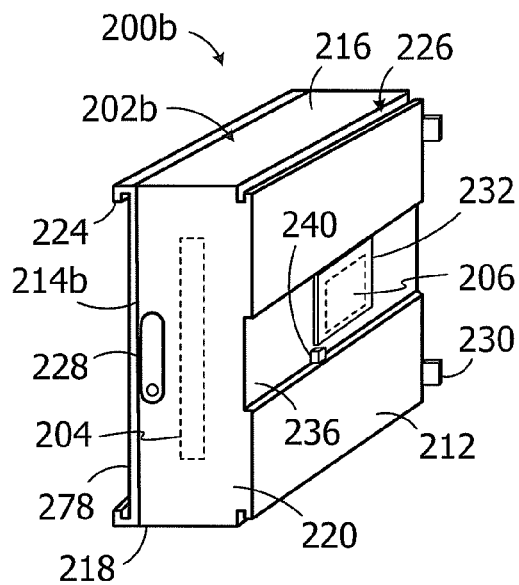
FIG. 33 is a perspective view of a data processing module in accordance with one embodiment of a present invention.
Figure 34:
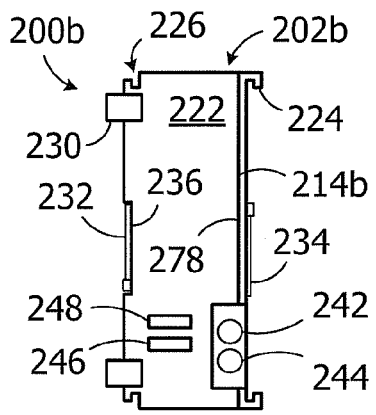
FIG. 34 is a rear view of the data processing module illustrated in FIG. 33.
Figure 35:
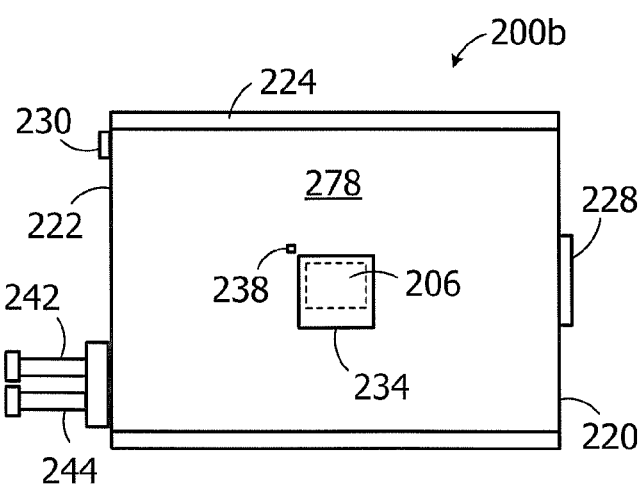
FIG. 35 is a side view of the data processing module illustrated in FIG. 33.
Figure 36:
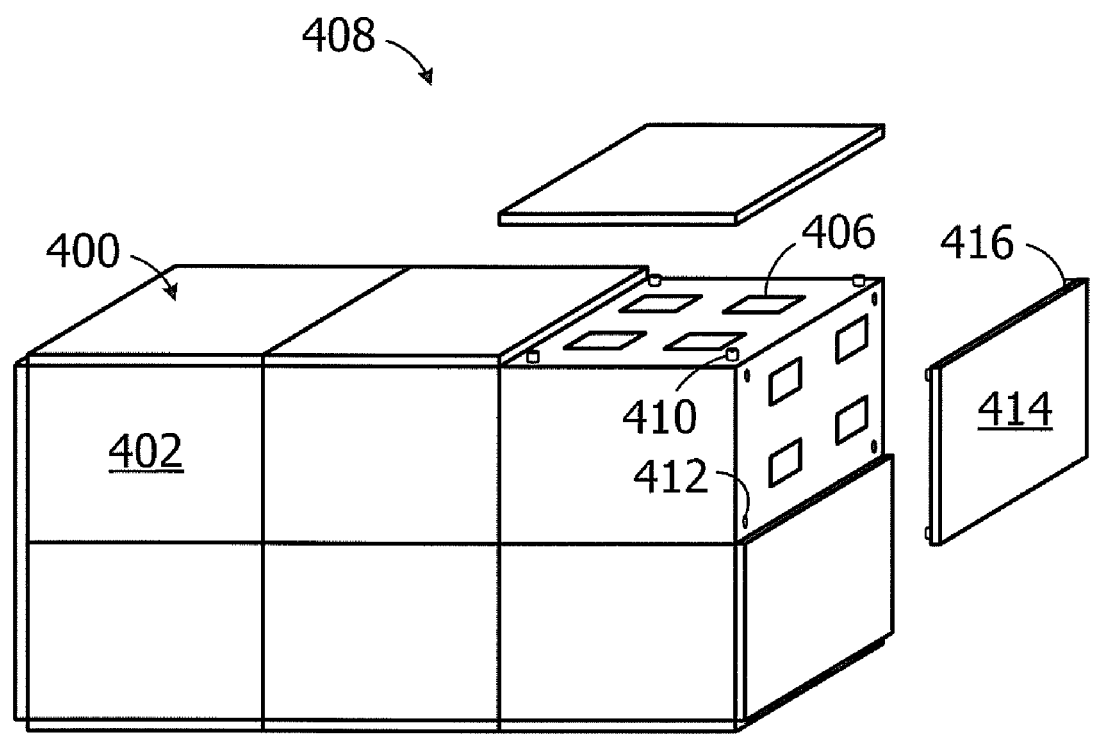
FIG. 36 is a partially exploded perspective view of a data processing system in accordance with one embodiment of a present invention.

Turning to FIG. 32, the exemplary data processing module 200a includes a housing 202a, four circuit boards 204 with various ASICs and/or other components generally represented by reference numeral 250, and four of optical interfaces 206 that are associated with the exterior of the module. The circuit boards 204 are connected to one another with flex circuits 260. The exemplary data processing module 200a is also representative of the fact that different types of optical interfaces may be employed in the same module. Here, two of the optical interfaces include optoelectronics 262, a light pipe 264, and a microlens array 266. The other two optical interfaces include optoelectronics 268 and optical fiber bundles 270.

It should also be noted that the waveguides associated with the detectors may be slightly larger than the waveguides associated with the emitters in order to provide alignment tolerance. It should also be noted that data processing modules in accordance with the present inventions may include, either as part of the illustrated optical interfaces or as part of separate interfaces, a through-module optical connection in order to facilitate all module communication.

Figure 20:
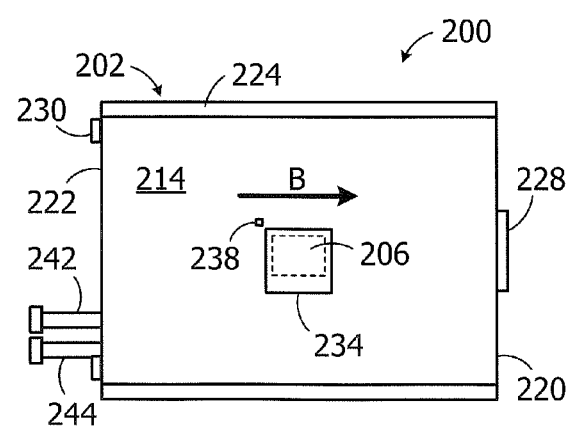
FIG. 20 is a side view of the data processing module illustrated in FIG. 15.
Figure 21:
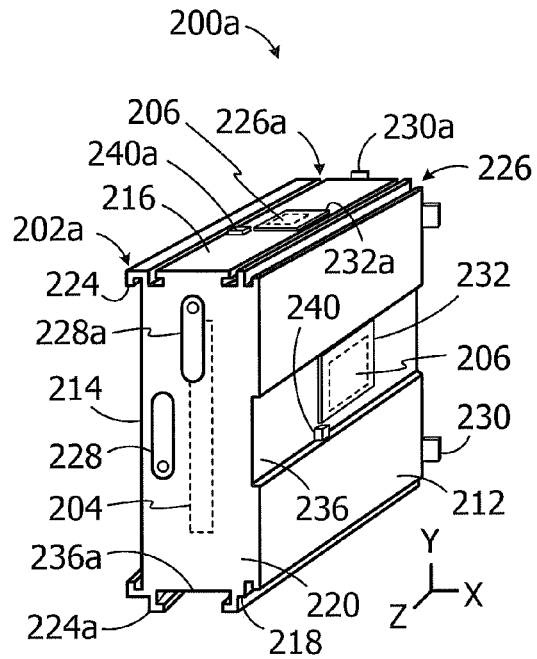
FIG. 21 is a front perspective view of a data processing module in accordance with one embodiment of a present invention.
Figure 22:
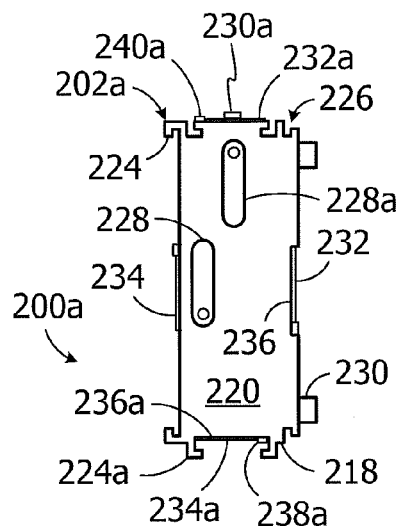
FIG. 22 is a front view of the data processing module illustrated in FIG. 21.
Figure 23:
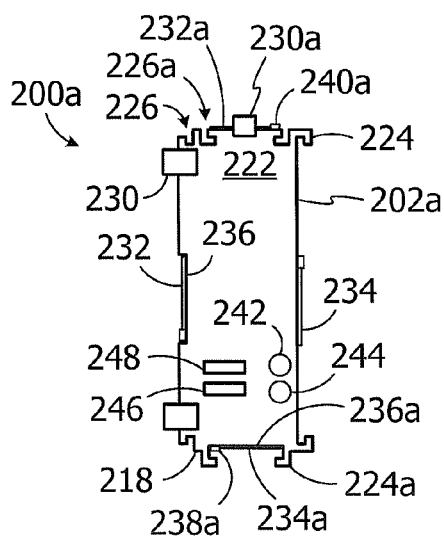
FIG. 23 is a rear view of the data processing module illustrated in FIG. 21.

With respect to cooling, the exemplary data processing module 100 is cooled by forcing air though the housing 102, as is described above in the context of FIGS. 7-14, while the data processing modules 200, 200a and 300 are fluid cooled though the use of a cooling jacket. Such cooling jackets may employ air cooling, highly heat conductive material in contact with backplane liquid cooling, or may employ liquid cooling techniques such as sensible heat gain or two-phase liquid cooling. Referring more specifically to FIG. 30, the exemplary module 200 includes an internal cooling jacket 272 that is connected to the fluid inlet 242 and fluid outlet 244 (FIGS. 19 and 20). The cooling jacket 272 is secured to the housing wall 214 and, accordingly, includes an opening 274 for the light pipe 256. Alternatively, as is illustrated in FIG. 32, a cooling jacket 276 without such an opening may be mounted along the centerline of the housing 202a.

Cooling jackets may also be mounted on the exterior of a data processing module housing. One example of such a module is the exemplary data processing module 200b illustrated in FIGS. 33-35. The exemplary data processing module 200b is substantially similar to the above-described data processing module 200 and similar elements are represented by similar reference numerals. Here, however, a cooling jacket 278 is secured to the exterior of the housing wall 214b. The housing, or at least the wall 214b, may also be formed from heat conductive material. The rails 224 may be made part of the cooling jacket 278. Additionally, the optical interface 206 extends to the exterior surface of the cooling jacket 278 by way of an aperture that extends through the cooling jacket and is aligned with the housing aperture 252 (FIG. 30). The optical interface cover 234 is slidably mounted on the cooling jacket 278 and the tab 238 is mounted on the cooling jacket.

The data processing modules described above include a single cooling jacket. Nevertheless, it should be noted that data processing modules in accordance with the present inventions may also be provided with a plurality of cooling jackets within the housing, on the exterior of the housing, or some combination thereof. In other embodiments, one or more cooling jackets may be used to form the one or more of the walls of a data processing module.

Although the present inventions have been described in terms of the preferred embodiments above, numerous modifications and/or additions to the above-described preferred embodiments would be readily apparent to one skilled in the art.

By way of example, but not limitation, data processing modules in accordance with the present invention may include a plurality of optical interfaces associated with the exterior of one of the sides of the module, or more than one of the sides, and the optical interface covers may be removable. The exemplary data processing module 400 illustrated in FIG. 36 includes a housing 402, one or more circuit boards (not shown), and sixteen optical interfaces 406 associated with the exterior of the housing (four per side on four sides). A plurality of the data processing modules 400 may be combined, using housing tabs 410 and apertures 412 that form a press fit and align the modules, without the use of an enclosure to form a data processing system 408. Various latching arrangements may also be employed to secure the modules to one another. The exemplary modules 400 also include removable optical interface covers 414 that may be used to cover the sides if the housing, some with apertures (not shown) and others with tabs 416). The covers 414 may be removed from the sides of the housings which include optical interfaces 406 that will be abutting one another. The exemplary data processing modules may be air or fluid cooled in the manner described above, and may also include the data, power and cooling fluid connectors described above.

It is intended that the scope of the present inventions extend to all such modifications and/or additions.

We claim:

1. A data processing module, comprising: a housing defining an exterior; at least one circuit board including at least one electronic component located within the housing; at least first and second optical interfaces associated with the exterior of the housing and operably connected to the at least one electronic component, and first and second slidable covers associated with the exterior of the housing and movable between covered positions where the first and second slidable covers respectively cover the first and second optical interfaces and uncovered positions where the first and second slidable covers respectively do not cover the first and second optical interfaces, wherein the first and second slidable covers are to be engaged by inwardly extending protrusions of a receptacle to move the first and second slidable covers from the covered position to the uncovered position.

2. A data processing module as claimed in claim 1, wherein the housing includes at least first and second air flow openings associated with opposite ends of the housing.

3. A data processing module as claimed in claim 1, wherein the housing includes a front end defining a front end height and a rear end defining a rear end height that is less than the front end height.

4. A modular data processing system, comprising:
an enclosure including a plurality of receptacles; and
at least first and second data processing modules, each of the first and second data processing modules including:
a housing defining an exterior;
at least one circuit board including at least one electronic component located within the housing; and
at least first and second optical interfaces associated with the exterior of the housing and operably connected to the at least one electronic component, wherein:
the enclosure receptacles and each of the data processing modules are respectively configured such that one data processing module optical interface will be aligned with, and in close proximity to, another data processing module optical interface when the data processing modules are inserted into adjacent enclosure receptacles; and
the receptacles each include first and second openings located such that the first and second optical interfaces of each data processing module will be aligned with the first and second openings when the data processing modules are inserted into enclosure receptacles.

5. A modular data processing system as claimed in claim 4, wherein there is a free space between the first and second openings.

6. A modular data processing system as claimed in claim 4, wherein there is an optical coupling apparatus associated with the first and second openings.

7. A modular data processing system as claimed in claim 4, wherein:
the enclosure receptacles include a front end defining a front end height and a rear end defining a rear end height that is less than the front end height; and
the housing includes a front end defining the front end height and a rear end defining the rear end height.

8. A modular data processing system as claimed in claim 4, wherein:
the housing of each of the data processing modules includes at least first and second openings associated with opposite ends of the housing; and
the enclosure includes a blower configured to create air flow from the first opening to the second opening of each housing.

9. A modular data processing system, comprising:
an enclosure including a plurality of receptacles; and
at least first and second data processing modules, each of the first and second data processing modules including:
a housing defining an exterior;
at least one circuit board including at least one electronic component located within the housing; and
at least first and second optical interfaces associated with the exterior of the housing and operably connected to the at least one electronic component, wherein:
the enclosure receptacles and each of the data processing modules are respectively configured such that one data processing module optical interface will be aligned with, and in close proximity to, another data processing module optical interface when the data processing modules are inserted into adjacent enclosure receptacles;
each data processing module includes first and second slidable covers associated with the exterior of the housing and movable between covered positions where the first and second slidable covers cover the first and second optical interfaces and uncovered positions where the first and second slidable covers do not cover the first and second optical interfaces; and
each enclosure receptacle includes first and second slots configured to receive the first and second slidable covers.

10. A modular data processing system as claimed in claim 9, wherein each enclosure receptacle includes first and second inwardly extending protrusions configured to engage the first and second slidable covers as the data processing module slides into the enclosure receptacle.

11. A modular data processing system as claimed in claim 9, wherein:
the housing of each of the data processing modules include at least first and second openings associated with opposite ends of the housing; and
the enclosure includes a blower configured to create air flow from the first opening to the second opening of each housing.

* * * * *